United States Patent
Kruijt-Stegeman et al.

(10) Patent No.: US 7,418,902 B2
(45) Date of Patent: Sep. 2, 2008

(54) IMPRINT LITHOGRAPHY INCLUDING ALIGNMENT

(75) Inventors: Yvonne Wendela Kruijt-Stegeman, Eindhoven (NL); Aleksey Yurievich Kolensnychenko, Helmond (NL); Helmar Van Santen, Amsterdam (NL); Erik Roelof Loopstra, Heeze (NL)

(73) Assignee: ASML Netherlands B.V., Veldhoven (NL)

( * ) Notice: Subject to any disclaimer, the term of this patent is extended or adjusted under 35 U.S.C. 154(b) by 279 days.

(21) Appl. No.: 11/139,991

(22) Filed: May 31, 2005

(65) Prior Publication Data

US 2006/0266244 A1    Nov. 30, 2006

(51) Int. Cl.
    *B41F 21/00* (2006.01)
(52) U.S. Cl. .................. 101/485; 425/385; 430/22
(58) Field of Classification Search ................ None
    See application file for complete search history.

(56) References Cited

U.S. PATENT DOCUMENTS

| | | | |
|---|---|---|---|
| 5,512,131 A | 4/1996 | Kumar et al. ............. 156/655.1 |
| 5,772,905 A | 6/1998 | Chou ............................ 216/44 |
| 6,165,911 A | 12/2000 | Calveley .................... 438/754 |
| 6,309,580 B1 | 10/2001 | Chou .......................... 264/338 |
| 6,334,960 B1 | 1/2002 | Willson et al. ................ 216/52 |
| 6,365,059 B1 | 4/2002 | Pechenik ...................... 216/52 |
| 6,375,870 B1 | 4/2002 | Visovsky et al. ........... 264/1.31 |
| 6,482,742 B1 | 11/2002 | Chou .......................... 438/690 |
| 6,518,189 B1 | 2/2003 | Chou .......................... 438/706 |
| 6,656,341 B2 | 12/2003 | Petersson et al. ............ 205/667 |
| 6,696,220 B2 | 2/2004 | Bailey et al. .............. 430/272.1 |
| 6,719,915 B2 | 4/2004 | Willson et al. ................ 216/44 |
| 6,902,853 B2* | 6/2005 | Sreenivasan et al. .......... 430/22 |
| 6,921,615 B2 | 7/2005 | Sreenivasan et al. .......... 430/22 |
| 6,972,844 B2* | 12/2005 | Tokita .......................... 430/22 |
| 2002/0093122 A1 | 7/2002 | Choi et al. ................... 264/401 |
| 2002/0094496 A1 | 7/2002 | Choi et al. ................... 430/322 |
| 2002/0098426 A1* | 7/2002 | Sreenivasan et al. .......... 430/22 |
| 2002/0115002 A1* | 8/2002 | Bailey et al. .................. 430/22 |
| 2002/0132482 A1 | 9/2002 | Chou .......................... 438/692 |
| 2002/0167117 A1 | 11/2002 | Chou .......................... 264/338 |
| 2002/0177319 A1 | 11/2002 | Chou .......................... 438/690 |
| 2003/0034329 A1 | 2/2003 | Chou ........................... 216/44 |

(Continued)

FOREIGN PATENT DOCUMENTS

WO    WO 01/79591 A1    10/2001

(Continued)

OTHER PUBLICATIONS

Stephen Y. Chou, et al., "Nanoimprint Lithography", J. Vac. Sci. Technol. B 14(6), Nov./Dec. 1996, pp. 4129-4133.

*Primary Examiner*—Jill E. Culler
(74) *Attorney, Agent, or Firm*—Pillsbury Winthrop Shaw Pittman, LLP

(57) ABSTRACT

An imprint lithography apparatus is disclosed that has a substrate table configured to hold a substrate, a template holder configured to hold an imprint template, the imprint template or the template holder having a template alignment mark configured to be imprinted onto the substrate table or onto a substrate to form an imprinted alignment mark, the imprint template having a functional pattern, and the template alignment mark and the functional pattern having a known spatial relationship, and an alignment sensor configured to determine the location of the imprinted alignment mark.

26 Claims, 7 Drawing Sheets

U.S. PATENT DOCUMENTS

| | | | |
|---|---|---|---|
| 2003/0080471 A1 | 5/2003 | Chou | 264/338 |
| 2003/0080472 A1 | 5/2003 | Chou | 264/338 |
| 2003/0081193 A1 | 5/2003 | White et al. | 355/72 |
| 2003/0127580 A1 | 7/2003 | Ling et al. | 249/115 |
| 2003/0139042 A1 | 7/2003 | Heidari | 438/689 |
| 2003/0141291 A1 | 7/2003 | Heidari et al. | 219/460.1 |
| 2003/0159608 A1 | 8/2003 | Heidari | 101/494 |
| 2003/0170053 A1 | 9/2003 | Montelius et al. | 399/318 |
| 2003/0189273 A1 | 10/2003 | Olsson | 264/293 |
| 2004/0005444 A1 | 1/2004 | Heidari | 428/212 |
| 2004/0009673 A1 | 1/2004 | Sreenivasan et al. | 438/694 |
| 2004/0021866 A1 | 2/2004 | Watts et al. | 356/401 |
| 2004/0022888 A1 | 2/2004 | Sreenivasan et al. | 425/174.4 |
| 2004/0036201 A1 | 2/2004 | Chou et al. | 264/402 |
| 2004/0046288 A1 | 3/2004 | Chou | 264/479 |
| 2004/0081798 A1 | 4/2004 | Lee et al. | 428/141 |
| 2004/0124566 A1 | 7/2004 | Sreenivasan et al. | 264/494 |
| 2004/0149367 A1 | 8/2004 | Olsson et al. | 156/64 |
| 2004/0169003 A1 | 9/2004 | Lee et al. | 216/4 |
| 2004/0192041 A1 | 9/2004 | Jeong et al. | 438/689 |
| 2004/0200411 A1 | 10/2004 | Willson et al. | 118/500 |
| 2004/0209470 A1 | 10/2004 | Bajorek | 438/689 |
| 2004/0219249 A1 | 11/2004 | Chung et al. | 425/385 |
| 2004/0219461 A1 | 11/2004 | Chung et al. | 430/311 |
| 2005/0039618 A1 | 2/2005 | Heidari et al. | 101/368 |
| 2005/0064054 A1 | 3/2005 | Kasumi | 425/112 |
| 2006/0035159 A1* | 2/2006 | Best et al. | 430/22 |

FOREIGN PATENT DOCUMENTS

| | | |
|---|---|---|
| WO | WO 01/79592 A1 | 10/2001 |

* cited by examiner

IMPRINT LITHOGRAPHY INCLUDING ALIGNMENT

1. FIELD

The invention relates to imprint lithography.

2. BACKGROUND

A lithographic apparatus is a machine that applies a desired pattern onto a target portion of a substrate. Lithographic apparatus are conventionally used, for example, in the manufacture of integrated circuits (ICs), flat panel displays and other devices involving fine structures.

It is desirable to reduce the size of features in a lithographic pattern because this allows for a greater density of features on a given substrate area. In photolithography, the increased resolution may be achieved by using light of shorter wavelength. However, there are problems associated with such reductions. Current systems are starting to adopt optical sources with wavelengths in the 193 nm regime but even at this level, diffraction limitations become a barrier. At lower wavelengths, the transparency of materials is very poor. Optical lithography machines capable of enhanced resolutions require complex optics and rare materials and are consequently very expensive.

An alternative for printing sub-100 nm features, known as imprint lithography, comprises transferring a pattern to a substrate by imprinting a pattern into an imprintable medium using a physical mould or template. The imprintable medium may be the substrate or a material coated on to a surface of the substrate. The imprintable medium may be functional or may be used as a "mask" to transfer a pattern to an underlying surface. The imprintable medium may, for instance, be provided as a resist deposited on a substrate, such as a semiconductor material, into which the pattern defined by the template is to be transferred. Imprint lithography is thus essentially a moulding process on a micrometer or nanometer scale in which the topography of a template defines the pattern created on a substrate. Patterns may be layered as with optical lithography processes so that, in principle, imprint lithography could be used for such applications as IC manufacture.

The resolution of imprint lithography is limited only by the resolution of the template fabrication process. For instance, imprint lithography may be used to produce features in the sub-50 nm range with significantly improved resolution and line edge roughness compared to that achievable with conventional optical lithography processes. In addition, imprint processes do not require expensive optics, advanced illumination sources or specialized resist materials typically required by optical lithography processes.

Imprint lithography may be used to manufacture multiple layer structures, such as integrated circuits. In order to manufacture such multiple layer structures, each layer is typically independently imprinted. For example, a first layer is imprinted on a substrate, following which the imprinted material is treated such that the imprinted pattern becomes fixed. A second layer is then imprinted on the first layer and treated, followed by third and fourth layers, etc. In some integrated circuit designs up to thirty layers may be used. Manufacture of multiple layer structures is commonplace using optical lithography apparatus. However, it has so far proved difficult to manufacture such structures using imprint lithography, due to difficulties in aligning the patterns of successive layers such that they correspond correctly. Alignment between successive layers should be achieved with high accuracy otherwise device components, which are constructed by several layers, will not contact one another or do so improperly with the result that the device components may not function as intended.

3. SUMMARY

According to a first aspect of the invention there is provided an imprint lithography apparatus, comprising:
a substrate table configured to hold a substrate;
a template holder configured to hold an imprint template, the imprint template or the template holder having a template alignment mark configured to be imprinted onto the substrate table or onto a substrate to form an imprinted alignment mark, the imprint template having a functional pattern, and the template alignment mark and the functional pattern having a known spatial relationship; and
an alignment sensor configured to determine the location of the imprinted alignment mark.

According to a second aspect of the invention there is provided a method of aligning an imprint template with a substrate on a substrate table, the imprint template or a template holder configured to hold the imprint template having a template alignment mark, the imprint template having a functional pattern, and the substrate having a substrate alignment mark, the method comprising:
imprinting the template alignment mark onto the substrate or onto the substrate table to form an imprinted alignment mark;
using an alignment sensor to measure a position of the imprinted alignment mark and a position of the substrate alignment mark; and
using a known spatial relationship between the template alignment mark and the functional pattern to align the functional pattern with respect to the substrate alignment mark.

According to a third aspect of the invention there is provided an imprint lithography template comprising a template alignment mark and a functional pattern, the template alignment mark spaced away from the functional pattern and having a known spatial location relative to the functional pattern, the template alignment mark configured to allow it to be imprinted onto a substrate table or onto a substrate to form an imprinted alignment mark.

According to a fourth aspect of the invention there is provided an imprint lithography template comprising a template holder and a removable template, the template holder having a template alignment mark, and the removable template having a functional pattern, the template alignment mark configured to be imprinted onto a substrate table or onto a substrate to form an imprinted alignment mark.

One or more embodiments of the invention are applicable to any imprint lithography process in which a patterned template is imprinted into an imprintable medium in a flowable state, and for instance can be applied to hot and UV imprint lithography as described herein.

4. BRIEF DESCRIPTION OF THE DRAWINGS

Embodiments of the invention will now be described, by way of example only, with reference to the accompanying schematic drawings in which corresponding reference symbols indicate corresponding parts, and in which.

Figure 3:
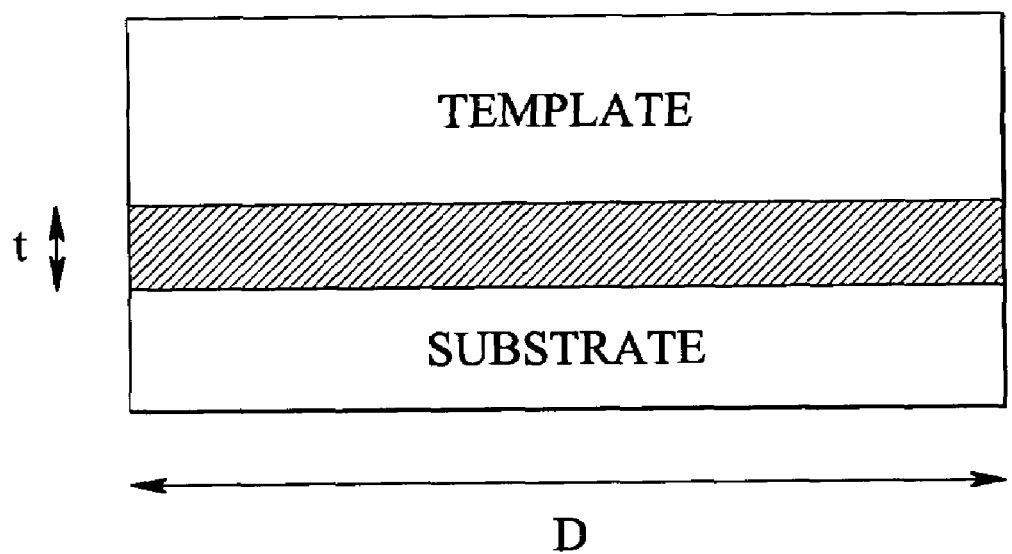
Figure 4:
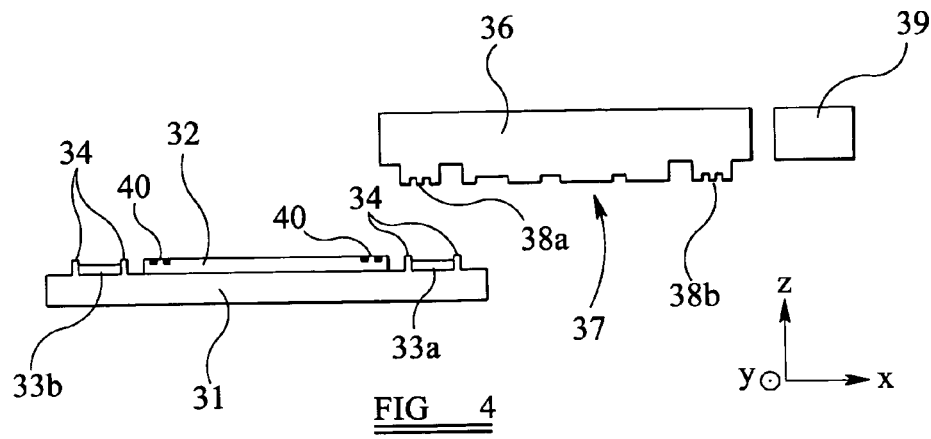
Figure 5:
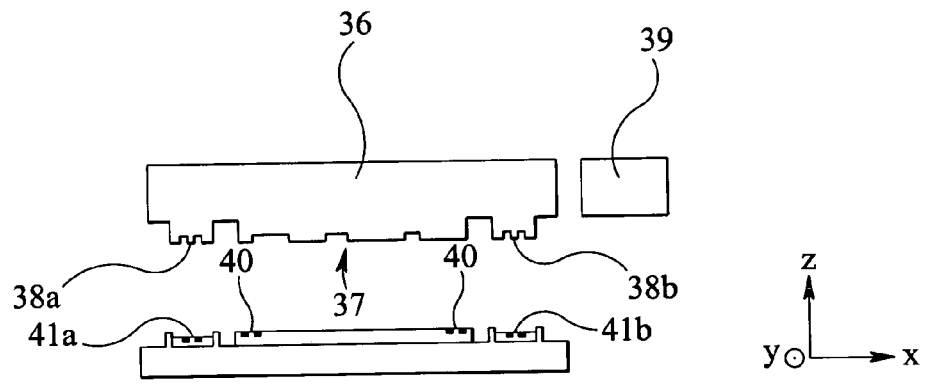
Figure 6:
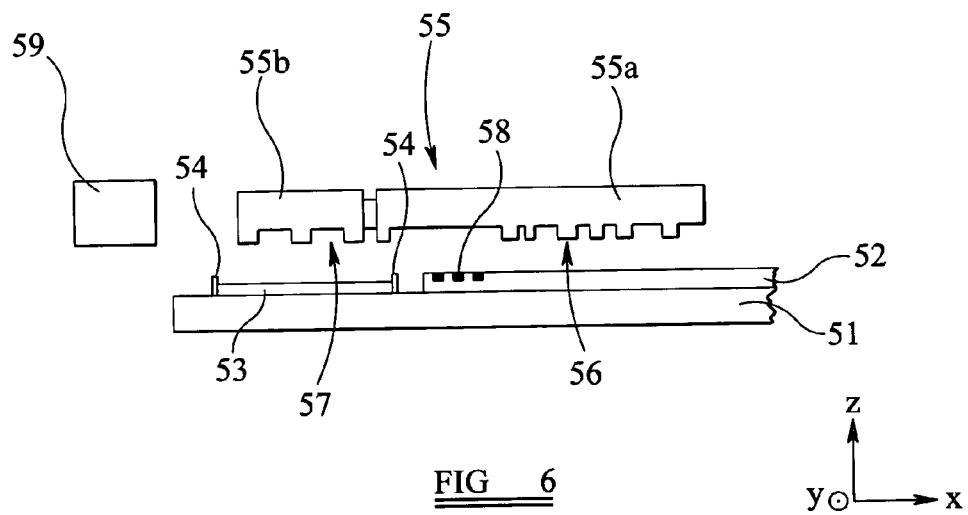
Figure 7:
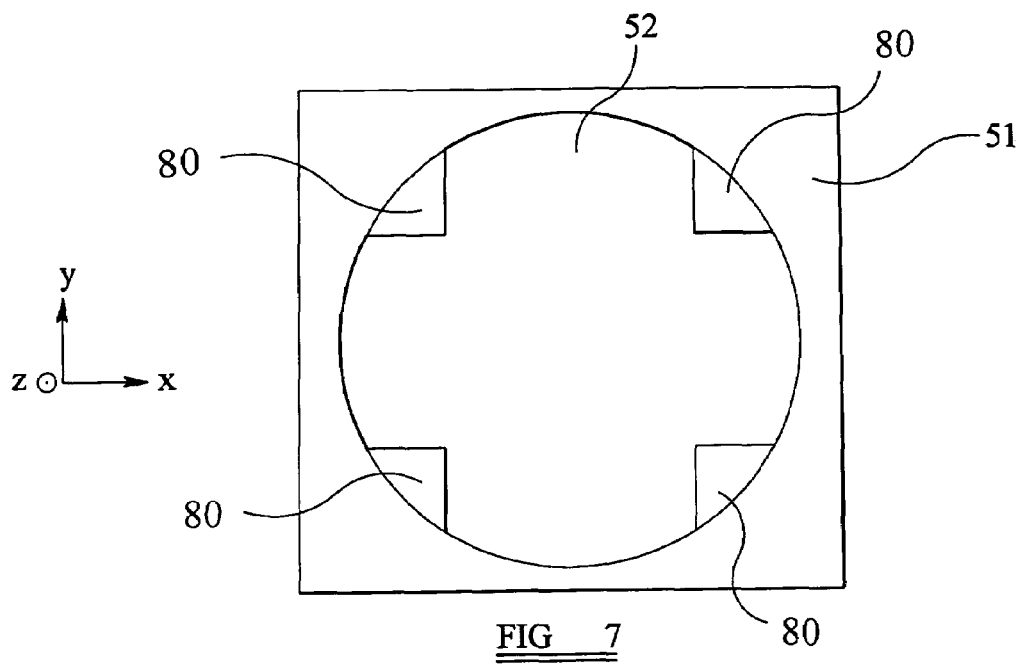
Figure 8:
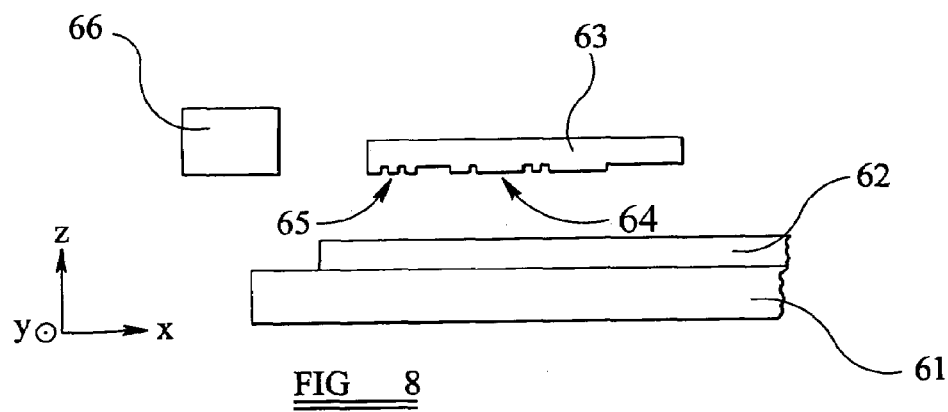

FIG. 3 schematically illustrates a template and a typical imprintable resist layer deposited on a substrate;

FIG. 4 schematically illustrates an imprint lithography apparatus according to an embodiment of the invention;

FIG. 5 shows the apparatus of FIG. 4 in a different configuration;

FIG. 6 schematically illustrates an another embodiment of the invention;

FIG. 7 schematically illustrates a top view of a substrate that may be used according to an embodiment of the invention;

FIG. 8 schematically illustrates a further embodiment of the invention; and

Figure 9:
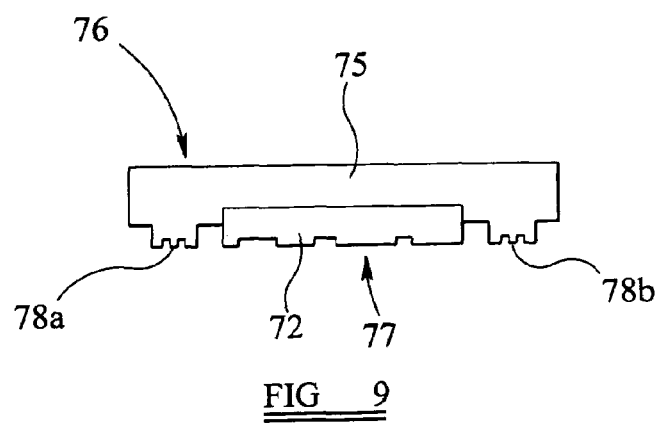

FIG. 9 schematically illustrates another embodiment of the invention.

5. DETAILED DESCRIPTION

There are two principal approaches to imprint lithography which will be termed generally as hot imprint lithography and UV imprint lithography. There is also a third type of "printing" lithography known as soft lithography. Examples of these are illustrated in FIGS. 1a to 1c.

Figure 1A:
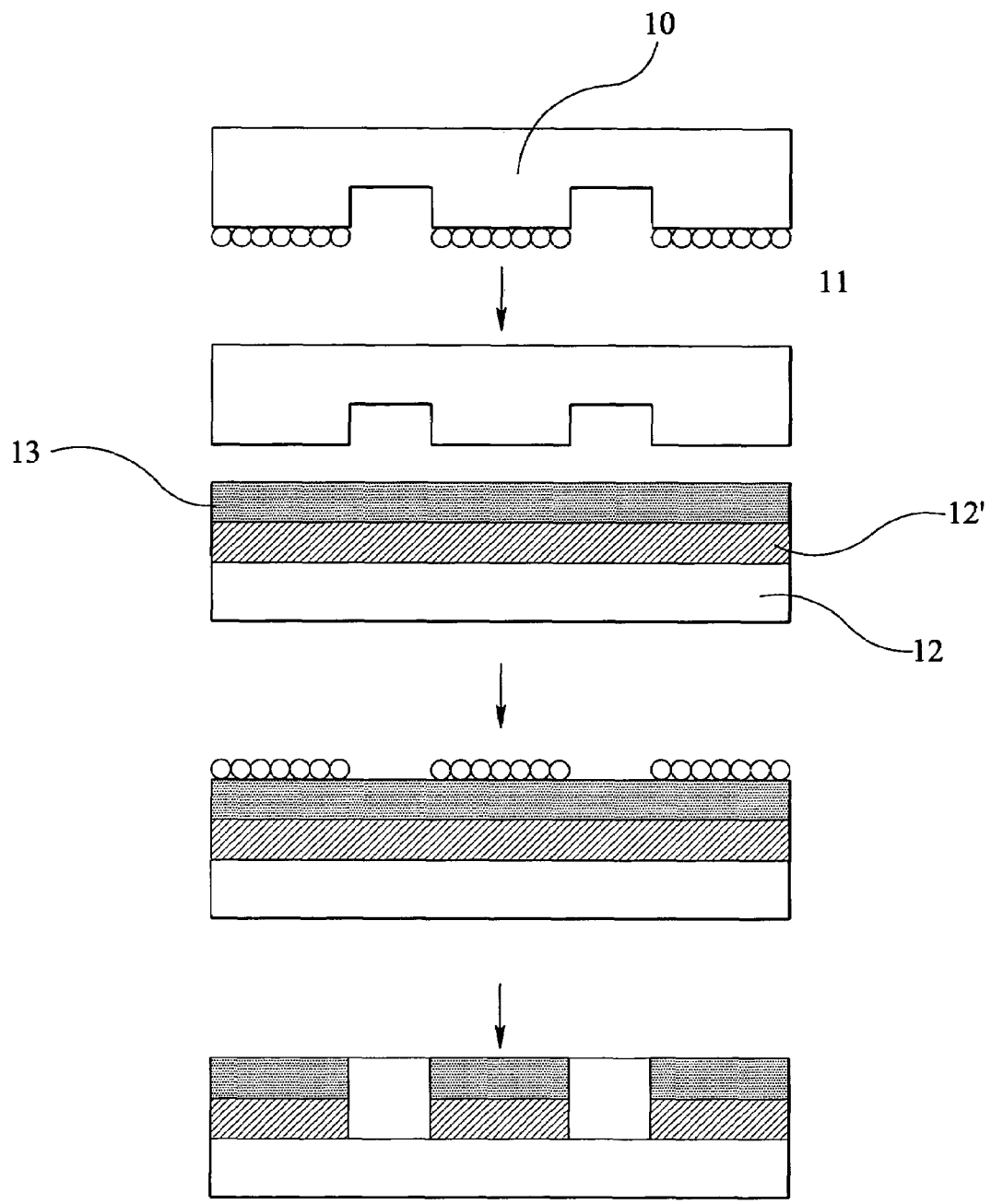
FIGS. 1a-1c illustrate examples of conventional soft, hot and UV lithography processes respectively.
Figure 1B:
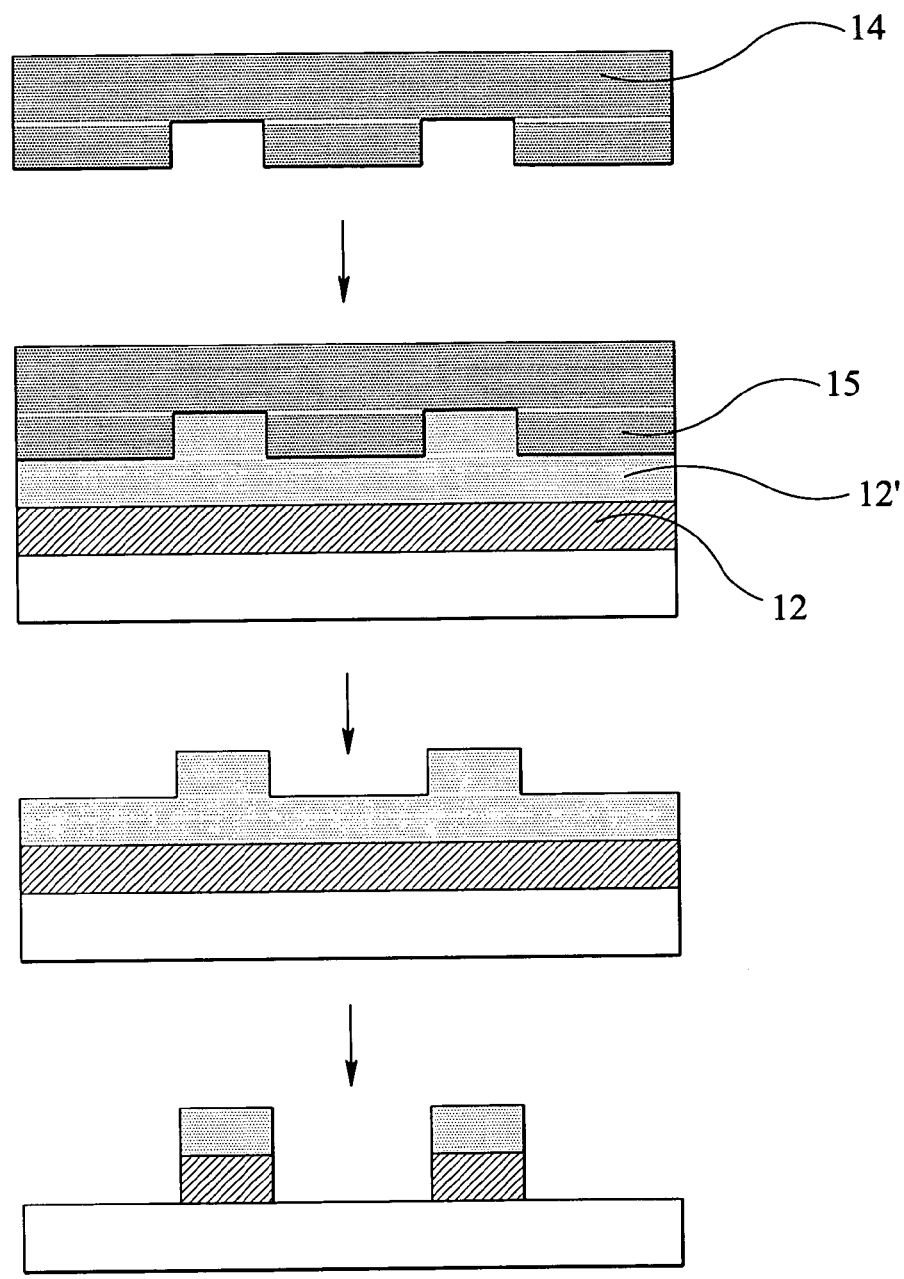
Figure 1C:
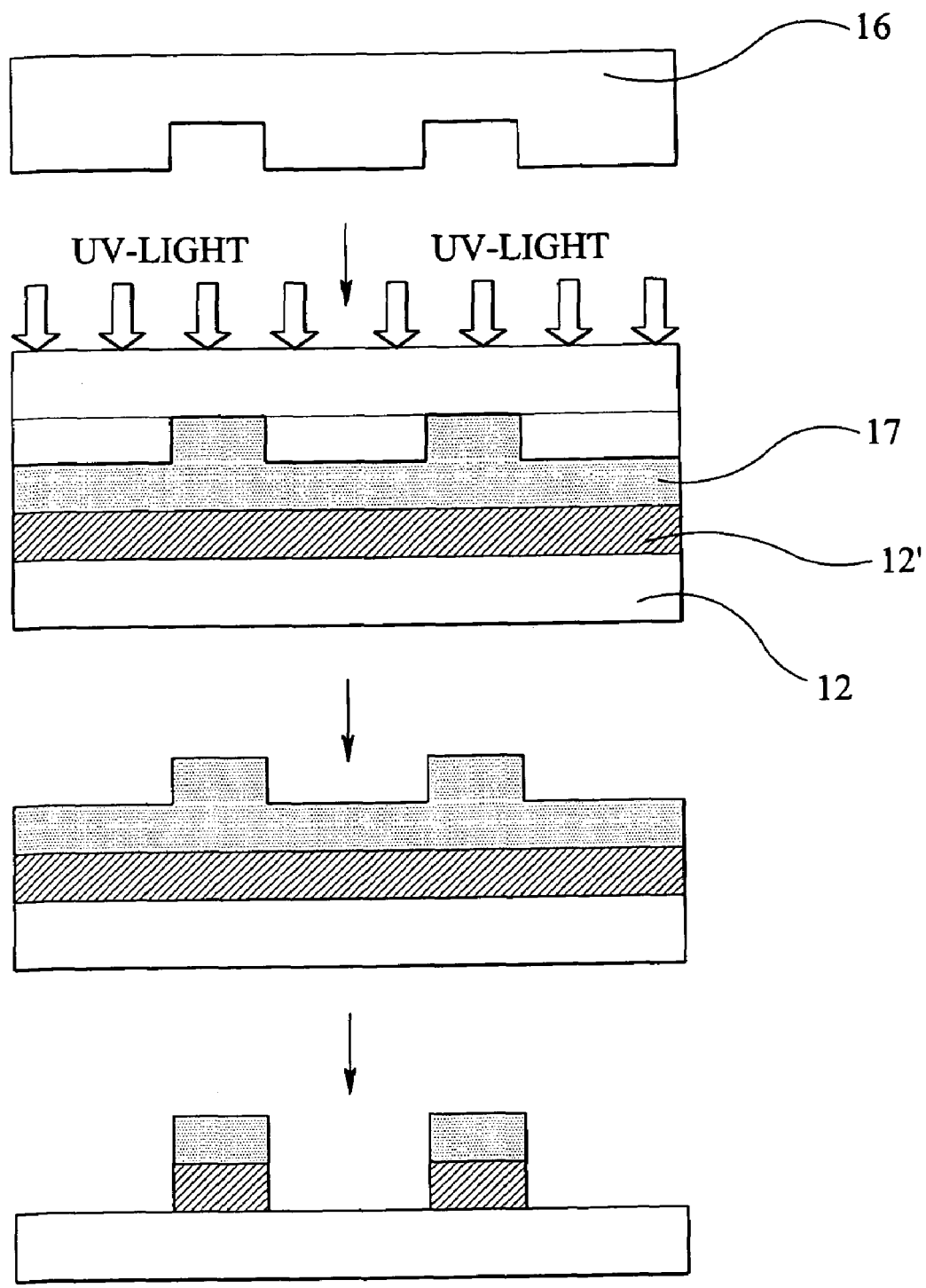

FIG. 1a schematically depicts the soft lithography process which involves transferring a layer of molecules 11 (typically an ink such as a thiol) from a flexible template 10 (typically fabricated from polydimethylsiloxane (PDMS)) onto a resist layer 13 which is supported upon a substrate 12 and planarization and transfer layer 12'. The template 10 has a pattern of features on its surface, the molecular layer being disposed upon the features. When the template is pressed against the resist layer, the layer of molecules 11 stick to the resist. Upon removal of the template from the resist, the layer of molecules 11 stick to the resist, the residual layer of resist is etched such that the areas of the resist not covered by the transferred molecular layer are etched down to the substrate.

The template used in soft lithography may be easily deformed and may therefore not be suited to high resolution applications, e.g. on a nanometer scale, since the deformation of the template may adversely affect the imprinted pattern. Furthermore, when fabricating multiple layer structures, in which the same region will be overlaid multiple times, soft imprint lithography may not provide overlay accuracy on a nanometer scale.

Hot imprint lithography (or hot embossing) is also known as nanoimprint lithography (NIL) when used on a nanometer scale. The process uses a harder template made from, for example, silicon or nickel, which are more resistant to wear and deformation. This is described for instance in U.S. Pat. No. 6,482,742 and illustrated in FIG. 1b. In a typical hot imprint process, a solid template 14 is imprinted into a thermosetting or a thermoplastic polymer resin 15, which has been cast on the surface of substrate. The resin may, for instance, be spin coated and baked onto the substrate surface or more typically (as in the example illustrated) onto a planarization and transfer layer 12'. It should be understood that the term "hard" when describing an imprint template includes materials which may generally be considered between "hard" and "soft" materials, such as for example "hard" rubber. The suitability of a particular material for use as an imprint template is determined by its application requirements.

When a thermosetting polymer resin is used, the resin is heated to a temperature such that, upon contact with the template, the resin is sufficiently flowable to flow into the pattern features defined on the template. The temperature of the resin is then increased to thermally cure (e.g. crosslink) the resin so that it solidifies and irreversibly adopts the desired pattern. The template may then be removed and the patterned resin cooled.

Examples of thermoplastic polymer resins used in hot imprint lithography processes are poly (methyl methacrylate), polystyrene, poly (benzyl methacrylate) or poly (cyclohexyl methacrylate). The thermoplastic resin is heated so that it is in a freely flowable state immediately prior to imprinting with the template. It is typically necessary to heat thermoplastic resin to a temperature considerably above the glass transition temperature of the resin. The template is pressed into the flowable resin and sufficient pressure is applied to ensure the resin flows into all the pattern features defined on the template. The resin is then cooled to below its glass transition temperature with the template in place whereupon the resin irreversibly adopts the desired pattern. The pattern will consist of the features in relief from a residual layer of the resin which may then be removed by an appropriate etch process to leave only the pattern features.

Figure 2:
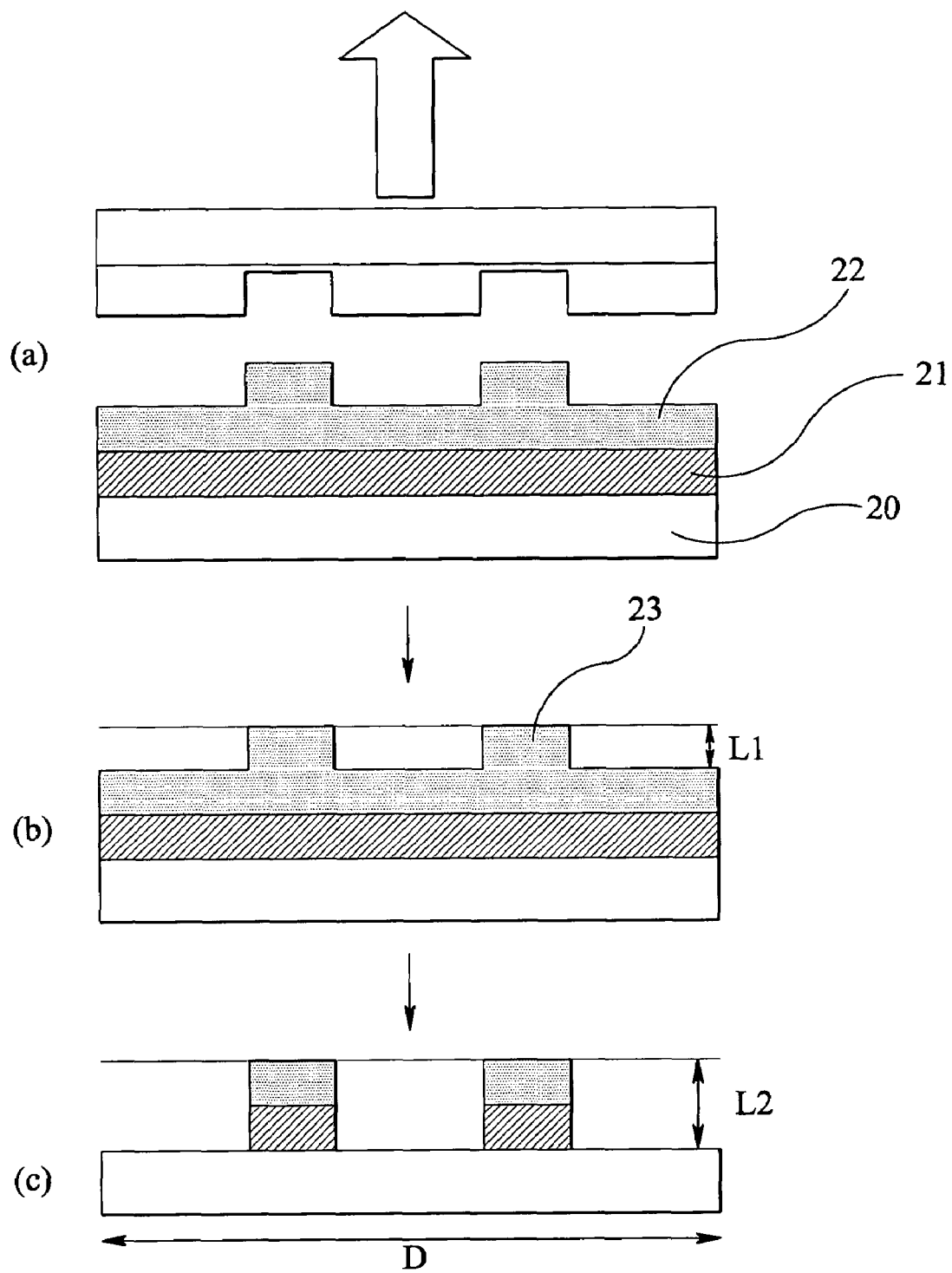
FIG. 2 illustrates a two step etching process employed when hot and UV imprint lithography is used to pattern a resist layer.

Upon removal of the template from the solidified resin, a two-step etching process is typically performed as illustrated in FIGS. 2a to 2c. The substrate 20 has a planarization and transfer layer 21 immediately upon it, as shown in FIG. 2a. The purpose of the planarization and transfer layer is twofold. It acts to provide a surface substantially parallel to that of the template, which helps ensure that the contact between the template and the resin is parallel, and also to improve the aspect ratio of the printed features, as described herein.

After the template has been removed, a residual layer 22 of the solidified resin is left on the planarization and transfer layer 21, shaped in the desired pattern. The first etch is isotropic and removes parts of the residual layer 22, resulting in a poor aspect ratio of features where L1 is the height of the features 23, as shown in FIG. 2b. The second etch is anisotropic (or selective) and improves the aspect ratio. The anisotropic etch removes those parts of the planarization and transfer layer 21 which are not covered by the solidified resin, increasing the aspect ratio of the features 23 to (L2/D), as shown in FIG. 2c. The resulting polymer thickness contrast left on the substrate after etching can be used as for instance a mask for dry etching if the imprinted polymer is sufficiently resistant, for instance as a step in a lift-off process.

Hot imprint lithography suffers from a disadvantage in that not only must the pattern transfer be performed at a higher temperature, but also relatively large temperature differentials might be required in order to ensure the resin is adequately solidified before the template is removed. Temperature differentials between 35 and 100° C. may be needed. Differential thermal expansion between, for instance, the substrate and template may then lead to distortion in the transferred pattern. This may be exacerbated by the relatively high pressure needed for the imprinting step, due the viscous nature of the imprintable material, which can induce mechanical deformation in the substrate, again distorting the pattern.

UV imprint lithography, on the other hand, does not involve such high temperatures and temperature changes nor does it require such viscous imprintable materials. Rather, UV imprint lithography involves the use of a partially or wholly transparent template and a UV-curable liquid, typically a monomer such as an acrylate or methacrylate. In general, any photopolymerizable material could be used, such as a mixture of monomers and an initiator. The curable liquid may also, for instance, include a dimethyl siloxane derivative. Such materials are less viscous than the thermosetting and thermoplastic resins used in hot imprint lithography and consequently move much faster to fill template pattern features. Low temperature and low pressure operation also favors higher throughput capabilities.

An example of a UV imprint process is illustrated in FIG. 1c. A quartz template 16 is applied to a UV curable resin 17 in a similar manner to the process of FIG. 1b. Instead of raising the temperature as in hot embossing employing thermosetting resins, or temperature cycling when using thermoplastic resins, UV radiation is applied to the resin through the quartz template in order to polymerize and thus cure it. Upon removal of the template, the remaining steps of etching the residual layer of resist are the same or similar as for the hot embossing process described herein. The UV curable resins typically used have a much lower viscosity than typical thermoplastic resins so that lower imprint pressures can be used. Reduced physical deformation due to the lower pressures, together with reduced deformation due to high temperatures and temperature changes, makes UV imprint lithography suited to applications requiring high overlay accuracy. In addition, the transparent nature of UV imprint templates can accommodate optical alignment techniques simultaneously to the imprinting.

Although this type of imprint lithography mainly uses UV curable materials, and is thus generically referred to as UV imprint lithography, other wavelengths of radiation may be used to cure appropriately selected materials (e.g., activate a polymerization or cross linking reaction). In general, any radiation capable of initiating such a chemical reaction may be used if an appropriate imprintable material is available. Alternative "activating radiation" may, for instance, include visible light, infrared radiation, x-ray radiation and electron beam radiation. In the general description herein, references to UV imprint lithography and use of UV radiation are not intended to exclude these and other activating radiation possibilities.

As an alternative to imprint systems using a planar template which is maintained substantially parallel to the substrate surface, roller imprint systems have been developed. Both hot and UV roller imprint systems have been proposed in which the template is formed on a roller but otherwise the imprint process is very similar to imprinting using a planar template. Unless the context requires otherwise, references to an imprint template include references to a roller template.

There is a particular development of UV imprint technology known as step and flash imprint lithography (SFIL) which may be used to pattern a substrate in small steps in a similar manner to optical steppers conventionally used, for example, in IC manufacture. This involves printing small areas of the substrate at a time by imprinting a template into a UV curable resin, 'flashing' UV radiation through the template to cure the resin beneath the template, removing the template, stepping to an adjacent region of the substrate and repeating the operation. The small field size of such step and repeat processes may help reduce pattern distortions and CD variations so that SFIL may be particularly suited to manufacture of IC and other devices requiring high overlay accuracy.

Although in principle the UV curable resin can be applied to the entire substrate surface, for instance by spin coating, this may be problematic due to the volatile nature of UV curable resins.

One approach to addressing this problem is the so-called 'drop on demand' process in which the resin is dispensed onto a target portion of the substrate in droplets immediately prior to imprinting with the template. The liquid dispensing is controlled so that a predetermined volume of liquid is deposited on a particular target portion of the substrate. The liquid may be dispensed in a variety of patterns and the combination of carefully controlling liquid volume sand placement of the pattern can be employed to confine patterning to the target area.

Dispensing the resin on demand as mentioned is not a trivial matter. The size and spacing of the droplets are carefully controlled to ensure there is sufficient resin to fill template features while at the same time minimizing excess resin which can be rolled to an undesirably thick or uneven residual layer since as soon as neighboring drops touch the resin will have nowhere to flow.

Although reference is made herein to depositing UV curable liquids onto a substrate, the liquids could also be deposited on the template and in general the same techniques and considerations will apply.

FIG. 3 illustrates the relative dimensions of the template, imprintable material (curable monomer, thermosetting resin, thermoplastic, etc) and substrate. The ratio of the width of the substrate, D, to the thickness of the curable resin layer, t, is of the order of $10^6$. It will be appreciated that, in order to avoid the features projecting from the template damaging the substrate, the dimension t should be greater than the depth of the projecting features on the template., The residual layer left after stamping is useful in protecting the underlying substrate, but as mentioned herein it may also be the source of a problem, particularly when high resolution and/or overlay accuracy is required. The first 'breakthrough' etch is isotropic (non-selective) and will thus to some extent erode the features imprinted as well as the residual layer. This may be exacerbated if the residual layer is overly thick and/or uneven. This problem may, for instance, lead to variation in the thickness of lines ultimately formed in the underlying substrate (i.e. variation in the critical dimension). The uniformity of the thickness of a line that is etched in the transfer layer in the second anisotropic etch is dependant upon the aspect ratio and integrity of the shape of the feature left in the resin. If the residual resin layer is uneven, then the non-selective first etch can leave some of these features with "rounded" tops so that they are not sufficiently well defined to ensure good uniformity of line thickness in the second and any subsequent etch process. In principle, the above problem may be reduced by ensuring the residual layer is as thin as possible but this can require application of undesirably large pressures (possibly increasing substrate deformation) and relatively long imprinting times (possibly reducing throughput).

The template is a significant component of the imprint lithography system. As noted herein, the resolution of the features on the template surface is a limiting factor on the attainable resolution of features printed on the substrate. The templates used for hot and UV, lithography are generally formed in a two-stage process. Initially, the desired pattern is written using, for example, electron beam writing, to give a high resolution pattern in resist. The resist pattern is then transferred into a thin layer of chrome which forms the mask for the final, anisotropic etch step to transfer the pattern into the base material of the template. Other techniques such as for example ion-beam lithography, X-ray lithography, extreme UV. lithography, epitaxial growth, thin film deposition, chemical etching, plasma etching, ion etching or ion milling could be used. Generally, a technique capable of very high resolution will be used as the template is effectively a 1×mask with the resolution of the transferred pattern being limited by the resolution of the pattern on the template.

The release characteristics of the template may also be a consideration. The template may, for instance, be treated with a surface treatment material to form a thin release layer on the template having a low surface energy (a thin release layer may also be deposited on the substrate).

Another consideration in the development of imprint lithography is the mechanical durability of the template. The template may be subjected to large forces during stamping of the resist, and in the case of hot lithography, may also be subjected to extremes of pressure and temperature. This may cause wearing of the template, and may adversely affect the shape of the pattern imprinted upon the substrate.

In hot imprint lithography, there is a potential advantage in using a template of the same or similar material to the substrate to be patterned in order to reduce differential thermal expansion between the two. In UV imprint lithography, the template is at least partially transparent to the activation radiation and accordingly quartz templates are used.

Although specific reference may be made in this text to the use of imprint lithography in the manufacture of ICs, it should be understood that imprint apparatus and methods described may have other applications, such as the manufacture of integrated optical systems, guidance and detection patterns for magnetic domain memories, hard disc magnetic media, flat panel displays, thin-film magnetic heads, etc.

While in the description herein, particular reference has been made to the use of imprint lithography to transfer a template pattern to a substrate via an imprintable resin effectively acting as a resist, in some circumstances the imprintable material may itself be a functional material, for instance having a functionally such as conductivity, optical linear or non-linear response, etc. For example, the functional material may form a conductive layer, a semi-conductive layer, a dielectric layer or a layer having another desirable mechanical, electrical or optical property. Some organic substances may also be appropriate functional materials. Such applications may be within the scope of the invention.

FIG. 4 shows a substrate table 31 upon which is provided a substrate 32 which is covered with a layer of imprintable medium. Also provided on the substrate table 31 are areas of imprintable medium 33a, 33b which are spaced away from the substrate 32. The areas of imprintable medium 33a, 33b are enclosed around their edges by walls 34.

Also shown in FIG. 4 is a template 36 held by a template holder (not shown for ease of illustration and clarity). The template 36 bears a pattern 37, for example one layer of an IC structure, which is to be imprinted onto the substrate 32. The pattern 37 will be hereafter referred to as the template device pattern 37. Separate template alignment marks 38a, 38b are provided at either end of the template 36, spaced away from the template device pattern 37.

An alignment sensor 39 is located adjacent to the template 36. For ease of reference a Cartesian coordinate system is shown in FIG. 4, labelled with x, y and z, as is conventional in lithography terminology. The template 36 is movable in the z-direction, to allow the template device pattern 37 to be imprinted onto the substrate 32. In an embodiment, the template is fixed in the x and y directions. In an embodiment, the alignment sensor 39 does not move.

The substrate 32 is provided with alignment marks 40. In an embodiment, the substrate table 31 is fixed in the z-direction, but is movable in the x and y directions.

In use, the substrate table 31 and template 36 are disposed relative to one another as shown in FIG. 4, such that a template alignment mark 38a is located substantially directly over an area of imprintable medium 33a on the substrate table 31. The template 36 is then moved downwards in the z-direction until the template alignment mark 38a presses into the area of imprintable medium 33a. Sufficient time is allowed to elapse such that the template alignment mark 38a is properly transferred to the area of imprintable medium 33a. The template 36 is then moved upwards in the z-direction to, for example, its original position. The area of imprintable medium 33a retains an imprint of the template alignment mark 38a. The x and y coordinates of the substrate table 31 during this imprint operation are recorded. The imprint of the template alignment mark 38a is shown schematically in FIG. 5 as imprinted alignment mark 41b. The imprint operation is repeated for the other template alignment mark 38b and the other area of imprintable medium 33b to yield imprinted alignment mark 41a.

The locations of the substrate alignment marks 40 and the imprinted alignment marks 41a, 41b are measured using the alignment sensor 39. The alignment sensor 39 may be an image sensor. Where an image sensor is used, the positions of the imprinted alignment marks 41a, 41b are determined by adjusting the location of the substrate table 31 in x and y directions so that an imprinted alignment mark 41a is located directly beneath the alignment sensor 39, and then recording the x and y coordinates of the substrate table 31. This is repeated for the other imprinted alignment mark 41b and for the substrate alignment marks 40.

The template alignment marks 38a, 38b and the template device pattern 37 have a known spatial relationship, i.e., the distance between the template alignment marks 38a, 38b and the template device pattern 37 is known and is fixed. The spatial relationship is known to a high degree of accuracy because the template device pattern 37 and the template alignment marks 38a, 38b are both provided on the same template 36, the dimensions and configurations of which are determined during manufacture of the template 36.

The measurements provided by the alignment sensor 39 indicate the locations of the substrate alignment marks 40 and the imprinted alignment marks 41a, 41b, as x and y coordinates of the position of the substrate table 31. Since the x and y coordinates of the substrate table 31 during imprint of the imprinted alignment marks 41a, 41b are known, the x and y coordinates of the template during imprint can be directly determined. This means that the location of the template 36 with respect to the substrate alignment marks 40 can be determined, which in turn means that the x and y position of the substrate table 31 can be adjusted accordingly so that the template device pattern 37 is imprinted onto the substrate 32 precisely at the desired location.

Due to the nature of the alignment measurements described, it is not necessary to assume that the template 36 moves only in the z-direction during imprint without deviating in the x or y directions. This is because it is the position of an imprint from the template 36 that is measured, using the imprinted alignment marks 41a, 41b, rather than the position of the template 36 itself. Provided that any deviation in the x or y direction during imprint is consistent for each imprint operation, the alignment process and system automatically takes account of these deviations by, for example, providing information to cause the substrate table 31 to move in the x or y directions to compensate.

Further, alignment may be performed using a single alignment sensor 39. There is no requirement for an additional alignment sensor to be located at the level of the substrate table 31 such that it can directly view the template 36.

Although one or more embodiments are described herein in relation to an imaging alignment sensor, the alignment sensor 39 may comprise any other suitable type of alignment sensor and that corresponding suitable alignment marks or devices may be used. For example, the alignment marks 40a, 40b, 41a, 41b may comprise diffraction gratings, and the alignment sensor may comprise lenses configured to separate and separately detect several diffraction orders (for example, as described in U.S. Pat. No. 6,297,876). When an alignment sensor of this type is used, alignment comprises scanning the alignment marks 40a, 40b, 41a, 41b underneath the alignment sensor 39 such that modulated signals arising from the diffraction pattern are seen at the alignment sensor 39. An embodiment of the invention allows such scanning alignment measurements to take place without the need for scanning motion of the template 36.

Although one or more embodiments are described herein in relation to two template alignment mark 38a, 38b and two substrate alignment marks 40a, 40b, more alignment marks may be used in practice. For example, four substrate alignment marks (not illustrated) may be disposed around the substrate 32 to allow the location of the substrate, any rotation of the substrate, and any expansion or contraction of the substrate to be determined. A larger number of substrate alignment marks may be used in order to increase the precision of the measurement of the substrate. For example, eight substrate alignment marks (not illustrated) may be provided at spaced apart locations on the substrate, and a subset of the eight substrate alignment marks may be used to measure the location of the substrate, the marks being selected on the basis of the perceived accuracy of their location (this is sometimes referred to as the n-of-m approach). A single substrate alignment mark may be used, although the alignment information obtainable from a single mark may be limited (for example, it may not provide rotation or magnification information).

Similarly, the template 36 may also be provided with more than two template alignment marks. For example, four template alignment marks (not illustrated) may be provided, one at each corner of the template 36. And, the substrate table 31 may be provided with more than two areas of imprintable material (not illustrated) configured to receive template alignment mark imprints. The number of areas of imprintable material provided to receive template alignment mark imprints need not be the same as the number of template alignment marks. For example, two template alignment marks 38a, 38b may be used in combination with four areas of imprintable material (not illustrated) on the substrate table 31, two being arranged to receive imprints from the first template alignment mark 38a, and two being arranged to receive imprints from the second template alignment mark 38b. In an alternative arrangement, one or more larger areas of imprintable material (not illustrated) may be provided, the one or more areas being sufficiently large that they may receive a plurality of template alignment mark imprints.

While the areas of imprintable material 33a, 33b are described and illustrated as being surrounded by walls 34, the walls 34 are provided for convenience to prevent the imprintable medium from spreading to other areas where it is not required. For example, instead of walls 34, the substrate table 31 may be provided with suitably located areas of anti-wetting coating, for example Teflon (a fluorinated polymer). The areas of anti-wetting coating are arranged to enclose the area in which the imprintable material is provided, and to prevent the imprintable material from spreading.

Although in the illustrated embodiment the template alignment marks 38a, 38b are imprinted into the target area 33 on the substrate table 31, it is also possible to imprint the template alignment marks 38a, 38b. onto a dedicated region or regions of the substrate 32 itself. Such dedicated regions could, for example, be located around the edge of the substrate 32.

In some instances, it may be possible to use a region of the template device pattern 37 as a template alignment mark. For example, if a region at the edge of the template device pattern 37 were to have a structure that could be used by the alignment sensor 39 to determine an accurate position measurement, then the structure could be imprinted at the target areas 33a, 33b, thereby allowing alignment to take place. Following alignment the entire template device pattern 37 would be imprinted onto the substrate 32 as normal. Where this is done, the target areas 33a, 33b, in an embodiment, are not provided with walls 34 to avoid the possibility that the walls 34 damage the template device pattern 37. Where appropriate, the use of a part of a template device pattern as a template alignment mark may be applied to embodiments described further below.

In the embodiment described in FIGS. 4 and 5, the functional pattern 37 is dimensioned so as to allow imprint of an entire substrate 32 in a single operation, for example wherein the functional pattern comprises an array of dies. It may be desired to apply the an embodiment of the invention to an imprint apparatus in which the functional pattern is dimensioned to imprint a single die, the functional pattern being imprinted onto the substrate many times in order to imprint an array of dies. An example of a suitable apparatus is shown in FIG. 6.

FIG. 6 shows a substrate table 51 upon which is provided a substrate 52 which is covered with a layer of imprintable medium. The substrate table 51 is also provided with an area of imprintable material 53 which is enclosed by walls 54. A template 55 held by a template holder (not shown for ease of illustration and clarity) located above the substrate table 51 comprises a functional pattern part 55a, an underside of which is provided with a functional pattern 56, and an alignment mark part 55b, an underside of which is provided with an alignment mark 57. The functional pattern part 55a and the alignment mark part 55b are linked together such that they are independently movable in the z-direction. The relative locations of the functional pattern part 55a and the alignment mark part 55b in the x and y directions are substantially fixed. The substrate 52 is provided with an alignment mark 58. An alignment sensor 59 is located adjacent the imprint template 55.

In use, the substrate table 51 is moved until the alignment mark part 55b of the imprint template 55 is located over the area of imprintable material 53. The alignment mark part 55b is then moved downwards in the z-direction until it presses into the imprintable medium 53. Sufficient time is allowed to lapse such that the alignment mark 57 is properly transferred to the area of imprintable medium 53. The alignment mark part 55b is then moved upwards in the z-direction to, for example, its original position. The area of imprintable medium 53 retains an imprint of the alignment mark 57. The x and y coordinates of the substrate table 51 during this imprint operation are recorded. This operation may be repeated for other areas of imprint material at other locations on the substrate table (not shown in FIG. 6).

The location of the alignment mark imprinted into the area of imprintable material 53 is measured using the alignment sensor 59. The alignment sensor 59 also measures the location of the substrate alignment mark 58. For each measurement by the alignment sensor 59, the x and y coordinates of the substrate table 51 are recorded. This recorded data, together with the recorded x and y coordinates of the substrate table 51 during imprint of the alignment mark 57, is used to ensure that the functional pattern part 55a of the imprint template 55 is correctly located for the imprint of the functional pattern 56 onto the substrate 52.

The area of imprintable material 53 is described and illustrated as being surrounded by walls 54, which are provided for convenience to prevent the imprintable medium from spreading to other areas where it is not required. For example, instead of the walls 54, the substrate table 31 may be provided with suitably located areas of anti-wetting coating, for example Teflon (a fluorinated polymer). The areas of anti-wetting coating are arranged to enclose the area in which the imprintable material is provided, and to prevent the imprintable material from spreading.

In another embodiment, an imprint template of the type shown in FIG. 6 is used. However, instead of imprinting an alignment mark onto areas of imprintable medium provided on the substrate table 51, dedicated regions of a substrate 52 are used for this purpose. The dedicated regions may, for example, be provided at locations on the substrate in which it would not be possible to imprint a full die onto the substrate. An example of this is shown in FIG. 7, where four regions 80 which are not large enough to receive functional patterns instead receive the alignment mark.

Another embodiment of the invention is shown in FIG. 8. Referring to FIG. 8, a substrate table 61 is provided with a substrate 62 which is covered with a layer of imprintable material. An imprint template 63 held by a template holder (not shown for ease of illustration and clarity) is provided with a functional pattern 64, and in addition is provided with an alignment mark pattern 65. The alignment mark pattern 65 is sufficiently narrow that in use, when the functional pattern 64 is imprinted onto a target region, an alignment mark is imprinted into a scribe lane between the target region and an adjacent target region. The position of the imprinted alignment mark is compared using an alignment sensor 66 with an alignment mark already located in the scribe lane. The result of this comparison is used to make a feed forward adjustment of the x and y coordinates of the substrate table 61 for the imprint of the template 63 onto an adjacent target region. Additional alignment marks may be provided at one or more other sides of the imprint template.

The embodiment shown in FIG. 8 may also be used in the manner described further above in relation to the earlier figures. That is, the imprint template 63 may be imprinted into one or more dedicated regions on the substrate 62 or the substrate table 61, and the x and y coordinates of the imprinted alignment marks may be used, together with alignment marks already present on the substrate, to align the imprint template with the substrate.

In several of the above described embodiments, the template device pattern (functional pattern) and template alignment marks are described and illustrated as being provided on a single imprint lithography template. In some instances however, as shown in FIG. 9, the imprint lithography template 76 may comprise a template holder 75 with template alignment marks 78a, 78b, and a removable template 72 provided with the functional pattern 77. Where this is done, the spatial relationship between the template alignment marks 78a, 78b and the template device pattern 77 is determined after the removable template 72 has been fixed to the template holder 75. In an embodiment, the removable imprint lithography template 72 may comprises both the template alignment marks 78a, 78 and the functional pattern 77.

Although the alignment sensor 39, 59, 66 is illustrate in the described embodiments as being adjacent to the imprint template 36, 55, 63, the alignment sensor may be located elsewhere. All that is required is that the alignment sensor is capable of viewing the imprinted alignment marks when required to do so. In some instances the alignment sensor 39, 59, 66 may be configured to be moveable in the z-direction, for example, to adjust the distance between the alignment sensor and an imprinted alignment mark such that the alignment mark is properly focussed by the alignment sensor. In an arrangement, the substrate table may be moveable in the z-direction, for example for the same reason.

Although in the illustrated embodiments target areas of imprintable material are provided directly onto the substrate table 31, 51, the imprintable material may be provided in other manners on the substrate table. For example, the imprintable material may be provided on a separate piece of material which is then fixed to the substrate table to form the target area.

Although the use of suitably located areas of anti-wetting coating, for example Teflon (a fluorinated polymer), was described in relation to the particular embodiments, suitably located areas of anti-wetting coating may be applied to other embodiments. Similarly, where appropriate, other specific features of an embodiment of the invention may be applied to one or more other embodiments of the invention.

Although one or more embodiments are described as measuring the positions of the imprinted alignment mark and the substrate alignment mark directly, the measurement may be done indirectly, for example by measuring the position of the substrate alignment mark in relation to a pre-existing substrate table alignment mark (not illustrated), and measuring the position of the imprinted alignment mark in relation to the pre-existing substrate table alignment mark.

In the above described embodiments, the template device pattern may comprise any functional pattern, for example, an integrated circuit pattern, integrated optical system pattern, guidance and detection patterns for magnetic domain memories, a hard disk magnetic media pattern, a flat panel display pattern, a thin-film magnetic head pattern, etc.

While specific exemplary embodiments of the invention have been described above, it will be appreciated that the invention may be practiced otherwise than as described. The description is not intended to limit the invention.

The invention claimed is:

1. An imprint lithography apparatus, comprising:
a substrate table configured to hold a substrate, wherein the substrate table comprises, in use, one or more areas of imprintable material separate from the substrate arranged to receive an imprinted alignment mark such that, in use, the imprinted alignment mark is formed therein and the imprinted alignment mark is operable with an alignment sensor;
a template holder configured to hold an imprint template, the imprint template or the template holder having a template alignment mark configured to be imprinted onto the substrate table or onto a substrate to form an imprinted alignment mark, the imprint template having a functional pattern, and the template alignment mark and the functional pattern having a known spatial relationship; and
an alignment sensor configured to determine the location of the imprinted alignment mark.

2. The apparatus according to claim 1, wherein the template alignment mark is contained within the functional pattern.

3. The apparatus according to claim 1, wherein the template alignment mark is separated from the functional pattern.

4. The apparatus according to claim 3, wherein the template alignment mark is provided on a part of the imprint template which is moveable relative to a part of the imprint template having the functional pattern to allow an alignment mark to be imprinted onto the substrate table or onto the substrate independently from the functional pattern.

5. The apparatus according to claim 3, wherein the template alignment mark is located adjacent to the functional pattern and is dimensioned such that, when imprinted onto the substrate, the imprinted alignment mark will fall entirely within a scribe lane between target regions of a substrate.

6. The apparatus according to claim 1, wherein the imprint template is provided with a plurality of template alignment marks.

7. The apparatus according to claim 1, wherein a perimeter of each area of imprintable material is enclosed by a wall or a region of anti-wetting coating.

8. The apparatus according to claim 1, wherein the imprint template is removable, and the removable imprint template is provided with both the template alignment mark and the functional pattern.

9. The apparatus according to claim 1, wherein the imprint template is removable, and the template holder is provided with the template alignment mark.

10. The apparatus according to claim 1, wherein the alignment sensor is further configured to determine the location of an alignment mark provided on the substrate or on the substrate table.

11. A method of aligning an imprint template with a substrate on a substrate table, the imprint template or a template holder configured to hold the imprint template having a template alignment mark, the imprint template having a functional pattern, and the substrate having a substrate alignment mark, the method comprising:
   imprinting the template alignment mark onto the substrate or onto the substrate table to form an imprinted alignment mark;
   using an alignment sensor to measure a position of the imprinted alignment mark and a position of the substrate alignment mark; and
   using a known spatial relationship between the template alignment mark and the functional pattern to align the functional pattern with respect to the substrate alignment mark.

12. The method according to claim 11, comprising imprinting the template alignment mark onto the substrate or onto the substrate table to form a plurality of imprinted alignment marks, and using the alignment sensor to measure positions of the plurality of imprinted alignment marks.

13. The method according to claim 11, wherein the substrate is provided with a plurality of substrate alignment marks and the method comprises using the alignment sensor to measure positions of the plurality of substrate alignment marks.

14. The method according to claim 11, comprising imprinting the template alignment mark onto one or more areas of imprintable material on the substrate table.

15. The method according to claim 14, wherein a perimeter of each area of imprintable material is enclosed by a wall or a region of anti-wetting coating.

16. The method according to claim 11, comprising imprinting the template alignment mark onto one or more areas on the substrate, which areas do not subsequently receive an imprint of the functional pattern.

17. The method according to claim 11, wherein the template alignment mark is contained within the functional pattern.

18. The method according to claim 11, wherein the template alignment mark is separated from the functional pattern.

19. The method according to claim 18, wherein the template alignment mark is provided on a part of the imprint template which is moveable relative to a part of the imprint template having the functional pattern, the method comprising imprinting the template alignment mark onto the substrate table or onto the substrate, and then subsequently imprinting the functional pattern onto the substrate.

20. The method according to claim 11, comprising imprinting the template alignment mark onto one or more scribe lanes of the substrate.

21. The method according to claim 11, wherein the imprint template is removable, and the template alignment mark is provided on the template holder, and the method further comprises fixing the removable template to the template holder and then measuring the spatial relationship between the template alignment mark and the functional pattern.

22. The method according to claim 11, wherein the substrate table is provided with a pre-existing alignment mark, and measuring the position of the imprinted alignment mark and the substrate alignment mark comprises measuring a position of the substrate alignment mark in relation to the pre-existing alignment mark, and measuring a position of the imprinted alignment mark in relation to the pre-existing alignment mark.

23. An imprint lithography template comprising a template alignment mark and a functional pattern, the template alignment mark spaced away from the functional pattern and having a known spatial location relative to the functional pattern, wherein the template alignment mark is provided on a part of the imprint template which is moveable relative to a part of the imprint template having the functional pattern to allow an alignment mark to be imprinted onto the substrate table or onto the substrate independently from the functional pattern.

24. The template according to claim 23, wherein the template is configured to allow the template alignment mark to be imprinted prior to imprinting of the functional pattern onto the substrate.

25. An imprint lithography template comprising a template holder and a removable template, the template holder having a template alignment mark, and the removable template having a functional pattern, the template alignment mark configured to be imprinted onto a substrate table or onto a substrate to form an imprinted alignment mark.

26. The template according to claim 25, wherein the template is configured to allow the template alignment mark to be imprinted prior to imprinting of the functional pattern onto the substrate.

* * * * *

UNITED STATES PATENT AND TRADEMARK OFFICE
CERTIFICATE OF CORRECTION

PATENT NO.        : 7,418,902 B2                                    Page 1 of 1
APPLICATION NO.   : 11/139991
DATED             : September 2, 2008
INVENTOR(S)       : Kruijt-Stegeman et al.

It is certified that error appears in the above-identified patent and that said Letters Patent is hereby corrected as shown below:

Title Page (75) Inventors: "Aleksey Yurievich Kolensnychenko, Helmond (NL)" should read

--Aleksey Yurievich Kolesnychenko, Helmond (NL)--

Signed and Sealed this

Ninth Day of February, 2010

David J. Kappos
*Director of the United States Patent and Trademark Office*